United States Patent
Ding

(10) Patent No.: US 9,841,466 B2
(45) Date of Patent: Dec. 12, 2017

(54) DYNAMIC BATTERY LEVEL INDICATOR

(71) Applicant: THUNDER POWER NEW ENERGY VEHICLE DEVELOPMENT COMPANY LIMITED, Central (HK)

(72) Inventor: Jia-Wei Ding, Taipei (TW)

(73) Assignee: THUNDER POWER NEW ENERGY VEHICLE DEVELOPMENT COMPANY LIMITED, Central (HK)

( * ) Notice: Subject to any disclaimer, the term of this patent is extended or adjusted under 35 U.S.C. 154(b) by 0 days.

(21) Appl. No.: 14/994,154

(22) Filed: Jan. 13, 2016

(65) Prior Publication Data

US 2017/0192062 A1    Jul. 6, 2017

Related U.S. Application Data

(60) Provisional application No. 62/273,262, filed on Dec. 30, 2015.

(51) Int. Cl.
*G08B 21/00* (2006.01)
*G01R 31/36* (2006.01)
*H01M 10/48* (2006.01)

(52) U.S. Cl.
CPC ...... *G01R 31/3682* (2013.01); *H01M 10/488* (2013.01); *H01M 2220/20* (2013.01)

(58) Field of Classification Search
CPC ........... G01R 19/16542; G01R 31/3682; H02J 2007/005; H02J 7/0047
See application file for complete search history.

(56) References Cited

U.S. PATENT DOCUMENTS

| 5,594,345 A * | 1/1997 | Boehm ............... A61B 6/4405 320/132 |
| 6,191,557 B1 | 2/2001 | Gray et al. |
| 6,396,407 B1 * | 5/2002 | Kobayashi ......... G01R 31/3655 320/132 |

(Continued)

FOREIGN PATENT DOCUMENTS

DE   10 2005 026583 A1   12/2006
EP       2 196 370 A1     6/2010

(Continued)

OTHER PUBLICATIONS

European Search Report for EP 16 20 7060 dated May 22, 2017, 9 pages.

*Primary Examiner* — George Bugg
*Assistant Examiner* — Renee Dorsey
(74) *Attorney, Agent, or Firm* — Kilpatrick Townsend & Stockton LLP

(57) ABSTRACT

An improved battery level indicator is provided. A first portion of the battery level indicator can be filled with a first color to indicate a charge level or remaining power level of a battery. A second portion of the battery level indicator can be filled with a second color to indicate a discharge level or consumed power level of the battery. As the battery power continues to be consumed, the battery level indicator re-colors both portions of the battery level indicators periodically with the first and second colors. In some implementations, a small gap portion can be displayed between the two portions described above, and the small gap portion can be filled with a third color, with a color intensity level in between the first and second colors.

16 Claims, 5 Drawing Sheets

(56) References Cited

U.S. PATENT DOCUMENTS

| | | | | |
|---|---|---|---|---|
| 2002/0113575 | A1* | 8/2002 | Lee | H02J 7/0047 320/132 |
| 2003/0069704 | A1 | 4/2003 | Bean | |
| 2006/0185917 | A1* | 8/2006 | Ozeki | B60W 10/06 180/65.23 |
| 2011/0063119 | A1* | 3/2011 | Martin | H01M 10/48 340/636.19 |
| 2011/0181599 | A1* | 7/2011 | Cho | G01R 31/362 345/440 |
| 2011/0260877 | A1* | 10/2011 | Newman | H01M 10/48 340/636.19 |
| 2011/0320956 | A1* | 12/2011 | Singh | G06Q 30/0241 715/747 |
| 2012/0056591 | A1* | 3/2012 | Abe | H01M 10/3909 320/132 |
| 2012/0306450 | A1* | 12/2012 | Nakayama | G06F 1/263 320/134 |
| 2013/0277431 | A1* | 10/2013 | DiGiovanna | G06K 7/10881 235/462.42 |
| 2014/0068314 | A1* | 3/2014 | Kim | G06F 1/3212 713/340 |
| 2016/0046199 | A1* | 2/2016 | Butler | B60L 11/1846 320/106 |
| 2016/0141893 | A1* | 5/2016 | Lee | H02J 7/007 320/107 |
| 2016/0284195 | A1* | 9/2016 | Priest | G08B 21/182 |

FOREIGN PATENT DOCUMENTS

| | | |
|---|---|---|
| EP | 2 270 528 A2 | 1/2011 |
| GB | 2 461 514 A | 1/2010 |

* cited by examiner

DYNAMIC BATTERY LEVEL INDICATOR

CROSS-REFERENCE TO RELATED APPLICATIONS

The present application claims priority to U.S. Provisional Patent Application No. 62/273,262, filed on Dec. 30, 2015, the disclosure of which is hereby incorporated by reference in its entirety for all purposes.

FIELD

The present invention battery power indicator and, more particularly, to battery level indicator which can indicate an amount of battery power that has been consumed and an amount of battery power still remains in a battery.

BACKGROUND

A conventional battery power indicator typically indicates how much power left in a battery. The convention battery power indicator is typically displayed in a shape of an actual battery, with a portion of the battery shape being colored to indicate a remaining battery power level. For example, when the remaining battery power is between 60% to 100%, the conventional battery power indicator typically colors a corresponding portion of the battery shape with green; when the remaining battery power is between 20% to 60%, the conventional battery power indicator typically colors the corresponding portion of the battery shape with yellow; and when the remaining battery power is less than 20%, the conventional battery power indicator typically corresponding portion of the battery shape with red. One drawback with the conventional battery power indicator is while it indicates the remaining battery power and relative strength of the battery power until next charge with colors, it does not clearly indicate a progress of battery progress consumption.

BRIEF SUMMARY

Embodiments can facilitate a dynamic display of battery level. The present disclosure provides an improved battery level indicator by coloring the remaining battery power portion of the indicator with a first color and coloring the consumed battery power portion of the indicator with a second color. As the battery power continues to be consumed, the battery level indicator re-colors both portions of the battery level indicators periodically with the first and second colors. This creates a visual effect that can show a progress of battery consumption, i.e., a rate at which the battery is being consumed. In some implementations, a small gap portion can be displayed between the two portions described above, and the small gap portion can be filled with a third color, with a color intensity level in between the first and second colors. This small gap portion of the indicator can serve as a visual cue to indicate where the battery power relative to the entire battery power originally in the battery.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF THE DRAWINGS

The detailed description is set forth with reference to the accompanying figures. In the figures, the left-most digit(s) of a reference number identifies the FIG. in which the reference number first appears. The use of the same reference numbers in different FIGS. indicates similar or identical items.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

A battery level indicator in accordance with the disclosure can have a color indicating a level of battery power remaining in the battery and another color indicating a level of battery power that has been consumed thus far. In some embodiments, the display of battery power remaining is adjacent to the display of battery power that has been consumed thus far. To achieved this, a portion of battery power remaining in the battery level indicator can be filled with a first color and a portion of battery power consumed in the battery level indicator can be filled with a second color. The first color and the second color can be different. In some embodiments, none of the first and second colors is black or white. The display of battery remaining and consumed may be updated periodically to reflect a progress of battery consumption. As the battery power continues to be consumed, the portion of the battery power consumed in the battery level indicator can appear to push the portion of battery power remaining in the battery level indicator, and may provide a progress of battery consumption—i.e. how fast the battery power is being consumed.

Figure 1:
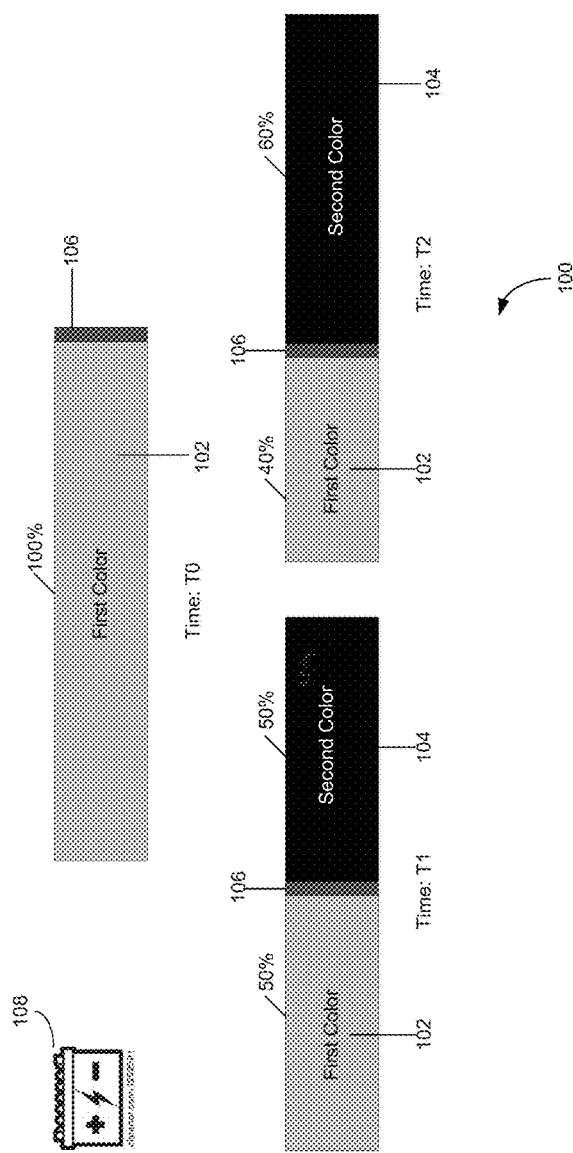
FIG. 1 illustrates some examples of battery level indicators in accordance with the disclosure.

FIG. 1 illustrates some examples of a battery level indicator 100 in accordance with the disclosure. As shown, the battery level indicator 100 can visually provide battery consumption information for battery 108, which in some examples can be a "smart battery". A smart battery typically can have a built-in battery management system (BMS). Thus in those example, battery 108 can internally measure voltage and current, and determine various parameters of the battery. The parameters determined by the battery 108 in those examples can include voltage, temperature, state of charge or depth of discharge, state of health, current, and/or any other parameters. The values of these parameters can be communicated externally by the battery 108, e.g., to a processor or to a CAN bus, which can process these parameter values to implement the battery level indicator 100 for display.

As illustrated in FIG. 1, the battery level indicator 100 can be in the shape of a bar. It should be understood this is not intended to be limiting. In some other examples, the shape of battery level indicator 100 can be of various shapes, such as a circular ring, an open oval, an actual battery, or any other shapes. In any case, as shown, the battery level indicator 100 can have a portion 102 indicating a charge level or remaining power level of battery 108. As shown, the portion 102 can be filled with a first color. As also shown, the battery level indicator 100 can have a portion 104 indicating a discharge level or consumed power level of battery 108. The portion 104 can be filled with a second color.

In FIG. 1, for illustration, the display of battery level indicator 100 is illustrated at three time instants: T0, T1 and T2. At time T0, battery 108 is at full charge, and thus portion 102 occupies the entire display area of the battery level indicator 100. As also shown, a small gap portion 106 may be displayed next right to portion 102. There are two purposes of displaying the small gap portion 106. First the small gap portion 106 can indicate there is potentially an error in the battery power information visually displayed in battery level indicator 100. As mentioned above, although a charge and/or discharge level can be calculated based on battery information provided by BMS, the accuracy of the battery information can vary. Sometimes there could be a small percentage or margin of error in the battery information provided by BMS. The small gap portion 106 can be used to indicate, more or less, the battery power is currently at a level indicated by the small gap portion 106. Second, the small portion 106 can give a cue where the remaining power is relative to the entire batter power so a user can easily discern a progress of the battery consumption as time progresses. In implementations, the size of the small portion 106 can be however desired, but preferably about 5% of the entire display area of battery level indicator 100.

As shown, at time T1, the battery charge level and discharge level is about at 50% each. As a result, portion 104 is filled with a second color to indicate a corresponding battery discharge level. At time T2, the battery charge level is at 40% and discharge level is at 60%. As a result, portion 104 has grown, as compared to that at time T1, to occupy more display area in the battery level indicator 100. This progressive growth of portion 104 at different times, such as from time T1 to T2, can provide a visual effect reflecting a progress at which the battery 108 is being discharged. In some implementations, the battery level indicator 100 can be updated once every second or few seconds to reflect the progress.

Figure 2:
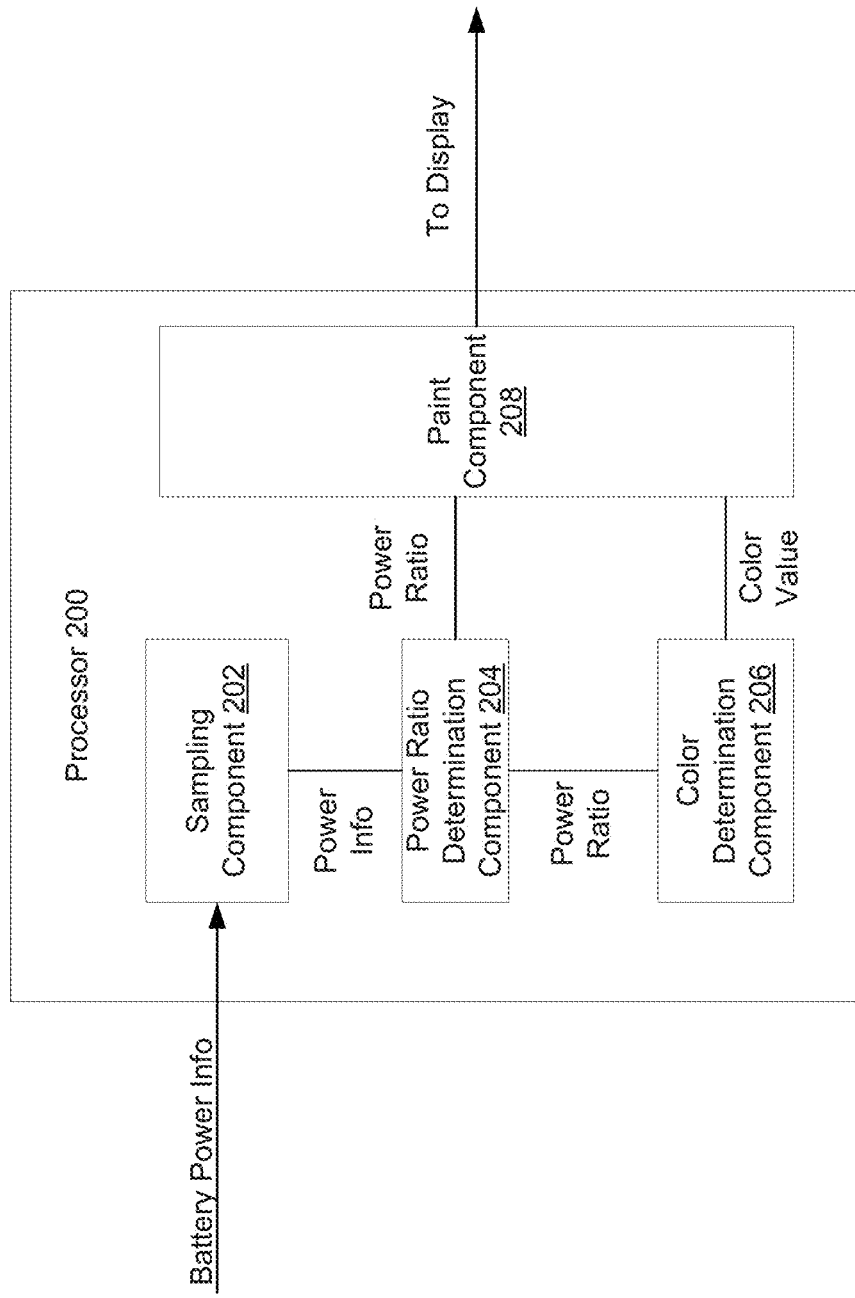
FIG. 2 illustrates a block diagram of a processor configured to implement a battery level indicator in accordance with one example of the disclosure.

With illustration of exemplary battery level indicator having been described, attention is now directed to FIG. 2, which illustrates a block diagram of a processor configured to implement a dynamic battery level indicator 100 shown in FIG. 1. As shown in this example, the processor 200 may be configured to include a sampling component 202, a power ratio determination component 204, a color determination component 206, a paint component 208 and/or any other components. The sampling component 202 can be configured to periodically obtain battery information from a BMS of a battery. For example, without limitation, the sampling component 202 may be configured to obtain the battery information once every second. The battery information obtained by the sampling component 202 may include battery charge level and/or battery discharge level at the time when the sampling component 202 obtains the battery information from BMS. In some examples, the sampling component 202 may be configured to decode the battery information received from the BMS to obtain the battery charge and/or discharge level values.

The power ratio determination component 204 can be configured to determine a ratio between the current charge level and discharge level of the battery based on the battery information obtained by the sampling component 202 for a given time instant. For example, at the given instant, the sampling component 202 may obtain a particular value for a charge level of the battery and the total charge level of the battery. As another example, at the given instant, the sampling component 202 may obtain a particular value for discharge level of the battery and a particular value for the charge level of the battery. The power ratio determination component 204 may be configured to determine a ratio between the charge level and discharge level based on the aforementioned battery information obtained by the sampling component 202. The ratio determined by the power ratio determination component 204 may be in the form of percentage, for example 10%, 20%, 30%, 40%, 50%, 60%, 70%, 90%, 100%, or any other percentage numbers. The ratio determined by the power ratio determination component 204 can thus indicate a power level of battery relative to total power of the battery.

The color determination component 206 can be configured to determine colors to be filled in a portion of battery level indicator indicating a charge level of the battery and a portion of battery level indicator indicating a discharge level of the battery. The colors determined by the color determination component 206 for these two different portions can be different. For example, without limitation, the color to be filled in the portion of battery level indicator indicating a charge level can be blue, and the color to be filled in the portion of battery level indicator indicating a discharge level of the battery can be red. In some examples, the colors determined by the color determination component 206 may not be black or white, as those colors tend not to provide a good visual to reflect a progress of battery consumption. In some embodiments, the color determination component 206 can be configured to determine a color to be filled in a gap portion (e.g., such as small gap portion 106 shown in FIG. 1) between the portion of battery level indicator indicating a charge level and the portion of battery level indicator indicating a charge level indicating a discharge level. The color determined for gap portion can be a color in between the colors for the aforementioned two portions in terms of intensity and color value. For example, the color for the gap portion can be magenta.

In some examples, the color determination component 206 can be configured to change the colors of the portion of battery level indicator indicating a charge level and/or the portion of the battery level indicator indicating the discharge level depending on battery power level. For example, a threshold can be set such that once the battery power drops below 20%, the portion indicating battery consumption can be colored with a color different from the color previously filled in the portion indicating battery consumption. In this way, it gives the user a visual cue to determine that the battery power level is low.

The paint component 208 can be configured to paint the display area of the battery level indicator according to the power ratio determined by the power ratio determination component 204 and the color values determined by color determination component 206. For example, without limitation, the power ratio determined by the power ratio determination component 204 can be 30/70%, meaning there are 70% power still left in the battery. In that example, the paint component 208 can determine that 70% of the display area of the battery level indicator can be filled with a first color value determined by the color determination component 206 and that 30% of the display area of the battery level indicator can be filled with a second color value determined by the color determination component 206. The frequency of the paint component 208 paints the display area of the battery level indicator can be as frequent as the power ratio determination component 204 determines the power ratio. In some embodiments, the paint component 208 is configured to re-paint the display area of the battery level indicator as soon as a new value of power ratio is received from the power ratio determination component 204.

Application of the battery level indicator in accordance with the disclosure can be in a wide areas. For example, the battery level indicator can be used on an electronic device that is connected to an external rechargeable battery, on a portable device such as mobile phone that has an embedded rechargeable battery, or merely on a battery itself. Among various applications of the battery level indicator contemplated, perhaps an important application of the battery level indicator is in a driving apparatus. The driving apparatus can comprise one or more batteries, and derives some of all of its power from the batteries. It is important for an operator of such a driving apparatus to be aware of the progress of battery consumption, i.e., a rate at which the batteries employed by the driving apparatus is being discharged, not just how much battery power is left. The battery level indicator in accordance with the disclosure can aid the operator of the driving apparatus to determine an approximate time frame in which the batteries in the driving apparatus will be discharged to a low level and thus needs to be recharged. An illustration of battery level indicator used in a driving apparatus is illustrated in FIG. 3.

Figure 3:
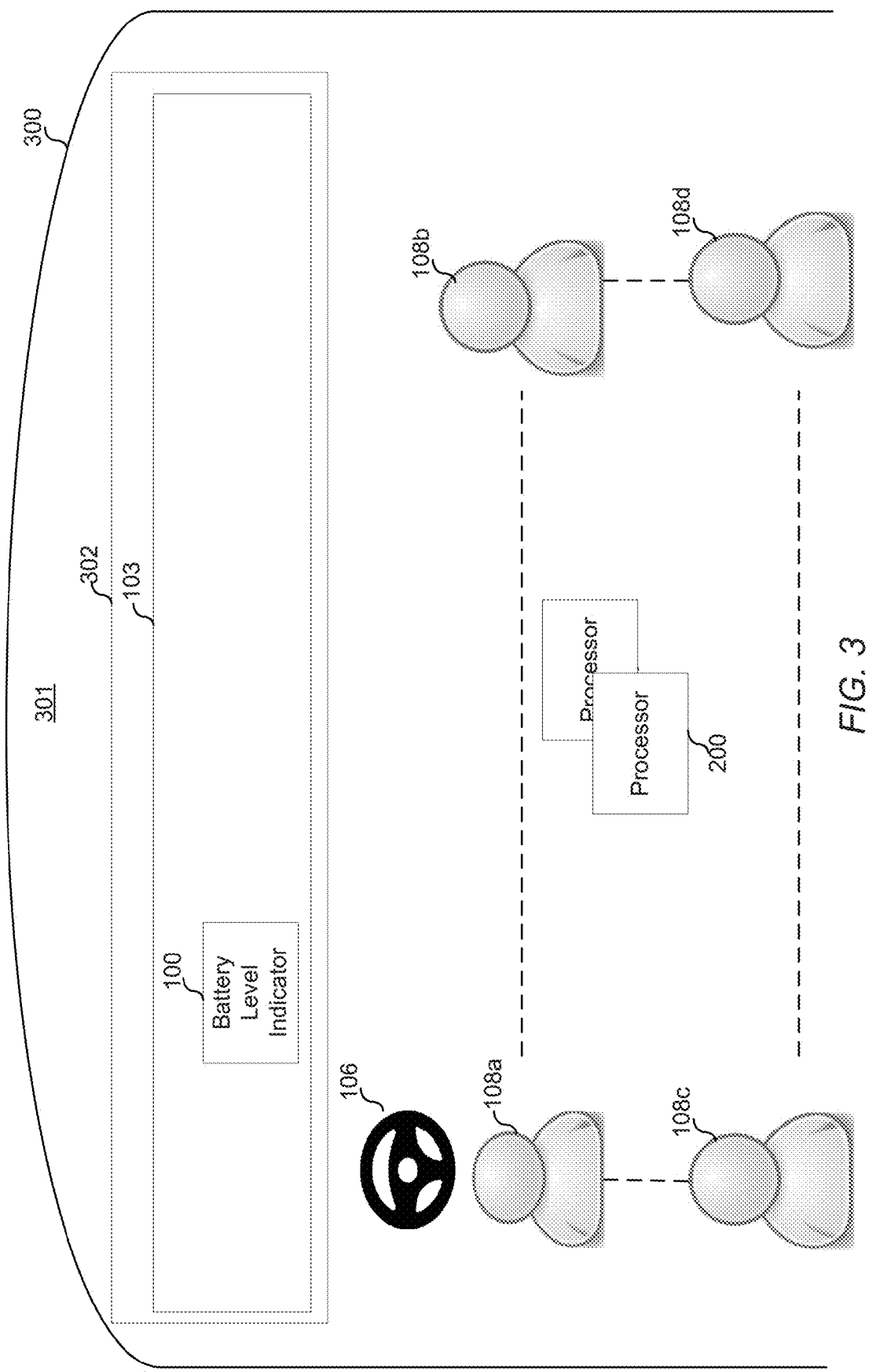
FIG. 3 illustrates generally illustrates a driving apparatus that can use a battery level indicator in accordance with the disclosure.

FIG. 3 generally illustrates an example of a driving apparatus 300 in accordance with the disclosure. The driving apparatus 300 may include any apparatus that moves in distance. Examples of driving apparatus 300 may include a vehicle such as a car, a bus, a train, a truck, a tram, or any other type of vehicle; may include a vessel such as a boat, a ship, a barge, a ferry or any other type of watercraft; may include an aircraft such as an airplane, a spaceship, or any other type of aircraft; or may include any other transportation apparatus. In one example, the driving apparatus 300 is an electrical automobile. As shown, the driving apparatus 300 may include a cabin 301 with a volume.

As shown in FIG. 3, in the cabin 301, there may be a dashboard 302 that has a screen 303. Although in this example, a dashboard screen 303 occupies the entire surface of the dashboard 302, this is not intended to be limiting. It is contemplated that in some cases, the dashboard screen 303 may occupy a portion of the dashboard 302 instead of the entire dashboard 302. In any case, the dashboard screen 303 is suitable to display one or more information panels. In implementations, the dashboard screen 303 may include any display technology, such as liquid-crystal display (LCD), crystal LCD, light-emitting diode (LED), organic light-emitting diode (OLED), active-matrix organic light-emitting diode (AMOLED), Plasma, projection panel, cathode ray tube (CRT), and/or any other display technology.

In some examples, information presented in the information panels may include gauge information related to the transportation apparatus 300, such as current speed/altitude/direction/wind, current longitude/latitude, distance traveled, RPM, fuel level, battery level, and/or any other gauge information related to the transportation apparatus 300. As shown in this example, the battery level indicator 100 can be displayed on the screen 303.

As still shown in FIG. 3, the driving apparatus 300 may comprise one or more steering wheels 306 in the cabin 303. Although only one steering wheel 306 is shown in FIG. 3, this is not intended to be limiting. In some examples, the driving apparatus 300 may include more than one steering wheel 306. For example, it is contemplated that the driving apparatus 300 may be an aircraft that comprises at least a main steering wheel 306 for the main pilot and at least a secondary steering wheel 306 for a co-polit.

As also shown in FIG. 3, one or more users 308 may be arranged to occupy their corresponding positions in the cabin 303. The users 308 may include one or more drivers that control the movement or navigation of the driving apparatus 300, one or more passengers, and/or any other type of users 308. In this example, the user 308a is a driver that controls the driving of the driving apparatus 300, while other users 308, e.g., users 308b-d, are passengers. As still shown, there may be multiple rows of users 308 within the cabin 303 of the transportation apparatus 300.

As still shown in FIG. 3, driving apparatus 300 may include one or more of a processor 200 (shown in FIG. 2) configured to implement battery level indicator 100.

Figure 4:
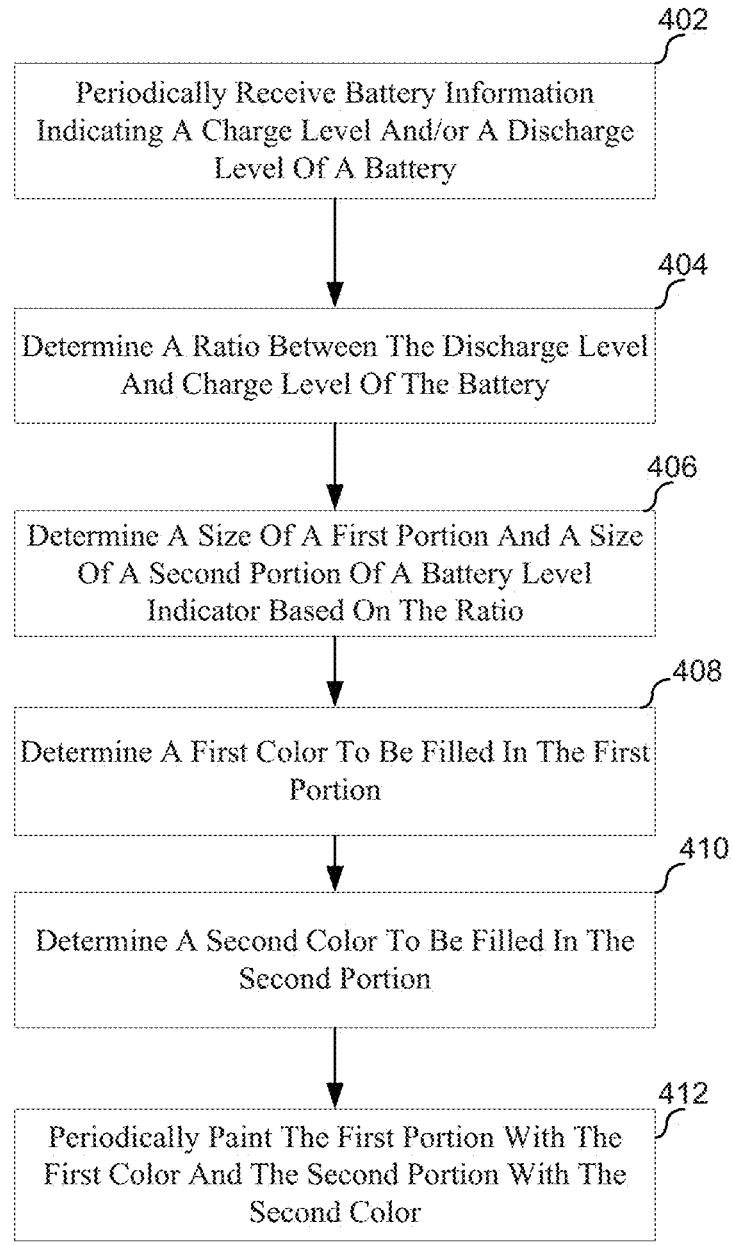
FIG. 4 illustrates an example of a process 400 for facilitating a battery level indicator in accordance with the disclosure.

FIG. 4 illustrates an example of a process 400 for facilitating a battery level indicator in accordance with the disclosure. Process 400 is illustrated as a logical flow diagram, the operation of which represents a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be combined in any order and/or in parallel to implement the processes.

Additionally, the process 400 can be performed under the control of one or more computer systems configured with executable instructions and can be implemented as code (e.g., executable instructions, one or more computer programs, or one or more applications) executing collectively on one or more processors, by hardware, or combinations thereof. The code can be stored on a computer-readable storage medium, for example, in the form of a computer program comprising a plurality of instructions executable by one or more processors. The computer-readable storage medium can be non-transitory.

At 402, battery information indicating a charge level and/or a discharge level of a battery can be periodically received. In some examples, 402 can be performed by sampling component the same as or substantially similar to the sampling component 202 described and illustrated herein.

At 404, a ration between the discharge level and charge level received at 402 can be determined. In some examples, 404 can be performed by power ratio determination component the same as or substantially similar to power ratio determination component 204 described and illustrated herein.

At 406, a size of a first portion of a battery level indicator can be determined to indicate remaining battery power level.

Also at 406, a size of a second portion of a battery level indicator can be determined to indicate consumed battery power level. In some embodiments, the first portion and second portion of the battery level indicator can occupy an entire area of the battery level indicator, and can be adjacent to each other. In those embodiments, the size of the first portion and the size of the second portion can reflect the ratio. In some examples, 406 can be performed by a paint component the same as or substantially similar to display parameter paint component 208 described and illustrated herein.

At 408, a first color to be filled in the first portion of the battery level indicator can be determined. In some examples, 408 can be performed by color determination component the same as or substantially similar to color determination component 206 described and illustrated herein.

At 410, a second color to be filled in the second portion of the battery level indicator can be determined. In some examples, 410 can be performed by color determination component the same as or substantially similar to color determination component 206 described and illustrated herein.

At 412, the first portion and the second portion of the battery level indicator can be periodically painted with the colors determined at 410. In some examples, 412 can be performed by paint component the same as or substantially similar to paint component 208 described and illustrated herein.

Figure 5:
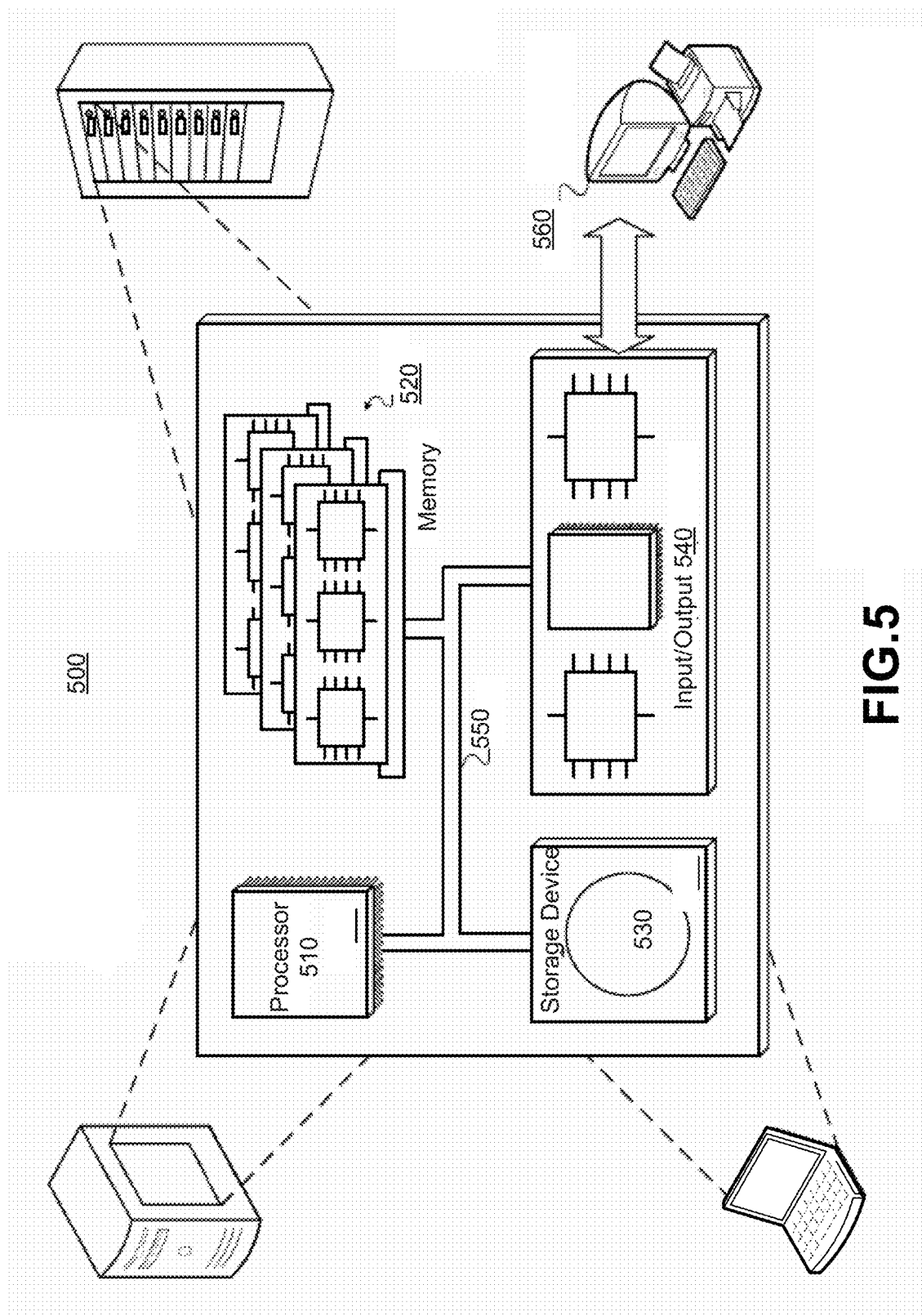
FIG. 5 is a schematic diagram showing an example of a computer system for implementing a dynamic display of brake force applied to a brake pedal in accordance with some embodiments.

Referring to FIG. 5, a schematic diagram is shown of an example of a computer system 500. This system is exemplary only and one having skill in the art will recognize that variations and modifications are possible. The system 500 can be used for the operations described above. For example, the computer systems shown in FIG. 5 may be used to implement any or all of the techniques and routines described herein for facilitating a dynamic display of brake force.

The system 500 includes a processor 510, a memory 520, a storage device 530, and an input/output interface 540. Each of the components 510, 520, 530, and 540 are interconnected using a system bus 550. The processor 510 is capable of processing instructions for execution within the system 500. In one implementation, the processor 510 is a single-threaded processor. In another implementation, the processor 510 is a multi-threaded processor. The processor 510 is capable of processing instructions stored in the memory 520 or on the storage device 530 to provide graphical information via input/output interface 540 for display on a user interface of one or more input/output device 560.

The memory 520 stores information within the system 500 and may be associated with various characteristics and implementations. For example, the memory 520 may include various types of computer-readable medium such as volatile memory, a non-volatile memory and other types of memory technology, individually or in combination.

The storage device 530 is capable of providing mass storage for the system 500. In one implementation, the storage device 530 is a computer-readable medium. In various different implementations, the storage device 530 may be a floppy disk device, a hard disk device, an optical disk device, or a tape device.

The input/output device 560 provides input/output operations for the system 500. In one implementation, the input/output device 560 includes a keyboard and/or pointing device. In another implementation, the input/output device 546 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other. Although a few implementations have been described in detail above, other modifications are possible.

The features described can be implemented in digital electronic circuitry, or in computer hardware, firmware, software, or in combinations of them. The apparatus can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

Where components are described as being configured to perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

A number of embodiments of the invention have been described. Nevertheless, it will be understood that various modification may be made without departing from the scope of the invention.

The specification and drawings are, accordingly, to be regarded in an illustrative rather than a restrictive sense. It will, however, be evident that additions, subtractions, deletions, and other modifications and changes may be made thereunto without departing from the broader spirit and scope. Illustrative methods and systems for providing features of the present disclosure are described above. Some or all of these systems and methods may, but need not, be implemented at least partially by architectures such as those shown in FIGS. 1-7 above.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

What is claimed is:

1. A computer-implemented method for displaying a battery level indicator, wherein the battery level indicator comprises a first portion of display area indicating a battery charge level, a second portion of display area indicating a battery discharge level, and a gap portion indicating a margin of error of the battery charge level, the method comprising:
    periodically receiving battery information indicating the charge level the discharge level of the battery, and a margin error of the charge level;
    determining a ratio between the discharge level and charge level of the battery;
    determining a size of the first portion and a size of the second portion based on the ratio;
    determining a size of the gap portion based on the size of the first portion, a size of the second portion and the margin of error, wherein the gap portion is between the first and second portions;
    determining a first color to be filled in the first portion;
    determining a second color to be filled in the second portion;
    determining a third color to be filled in the gap portion;
    periodically painting the first portion with the first color and the second portion with the second color to create a visual effect that shows a progress of a consumption of the battery such that the second portion appears to push the first portion gradually over the consumption of the battery, wherein the first color and second color are separate and distinct, and are not white, wherein the first portion and second portion of the battery level indicator occupy an entire display area of the battery level indicator and are adjacent to each other; and
    periodically painting the gap portion with the third color.

2. The computer-implemented method of claim 1, wherein the first color and/or the second color is not black or white.

3. The computer-implemented method of claim 1, wherein the determination of the first color to be filled in the first portion is based on the ratio such that if the ratio indicates the charge level of the battery is below a predetermined threshold, the first color is determined to be red.

4. The computer-implemented method of claim 1, wherein the size of the first portion and the size of the second portion reflect the ratio between the discharge level and charge level of the battery.

5. The computer-implemented method of claim 1, further comprising effectuating a display of the battery level indicator within a driving apparatus.

6. The computer-implemented method of claim 1, wherein the battery information is received from battery management system of a smart battery.

7. The computer-implemented method of claim 1, wherein the first and second portions are painted once every second.

8. A system for displaying a battery level indicator, wherein the battery level indicator comprises a first portion of display area indicating a battery charge level, a second portion of display area indicating a battery discharge level, and a gap portion indicating a margin of error of the battery charge level, the system comprising one or more processors configured by machine-readable instructions to perform:

periodically receiving battery information indicating the charge level and/or the discharge level of the battery, and a margin error of the charge level;

determining a ratio between the discharge level and charge level of the battery;

determining a size of the first portion and a size of the second portion based on the ratio;

determining a size of the gap portion based on the size of the first portion, a size of the second portion and the margin of error, wherein the gap portion is between the first and second portions;

determining a first color to be filled in the first portion;

determining a second color to be filled in the second portion;

determining a third color to be filled in the gap portion;

periodically painting the first portion with the first color and the second portion with the second color to create a visual effect that shows a progress of a consumption of the battery such that the second portion appears to push the first portion gradually over the consumption of the battery, wherein the first color and second color are separate and distinct, and are not white, wherein the first portion and second portion of the battery level indicator occupy an entire display area of the battery level indicator and are adjacent to each other; and periodically painting the gap portion with the third color.

9. The system of claim 8, wherein the first color and/or the second color is not black or white.

10. The system of claim 8, wherein the determination of the first color to be filled in the first portion is based on the ratio such that if the ratio indicates the charge level of the battery is blow a predetermined threshold, the first color is determined to be red.

11. The system of claim 8, wherein the size of the first portion and the size of the second portion reflect the ratio between the discharge level and charge level of the battery.

12. The system of claim 8, wherein the processor is further configured to perform effectuating a display of the battery level indicator within a driving apparatus.

13. The system of claim 8, wherein the battery information is received from battery management system of a smart battery.

14. The system of claim 8, wherein the first and second portions are painted once every second.

15. The method of claim 1, wherein the visual effect that shows a progress of continuing consumption of the battery is created such that the first portion appears to push the second portion.

16. The method of claim 1, wherein in the battery level indicator is painted as a rectangular shape.

* * * * *